United States Patent
Rae et al.

(10) Patent No.: US 6,768,083 B2
(45) Date of Patent: Jul. 27, 2004

(54) REFLOW SOLDERING APPARATUS AND METHOD FOR SELECTIVE INFRARED HEATING

(75) Inventors: Alan Rae, Hopkinton, MA (US); Mark A. Hodge, Lebanon, MI (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 10/247,402

(22) Filed: Sep. 19, 2002

(65) Prior Publication Data

US 2004/0056068 A1 Mar. 25, 2004

(51) Int. Cl.[7] .............................. F27D 11/00; F27B 9/06
(52) U.S. Cl. ...................... 219/388; 219/390; 219/494; 228/47.1; 228/234.1
(58) Field of Search ...................... 228/8, 9, 42, 47.1, 228/219, 19, 234.1, 254, 256, 246, 180.1, 180.22, 259, 110.1, 620, 621, 173.6; 219/388, 390, 494, 254

(56) References Cited

U.S. PATENT DOCUMENTS

| | | | |
|---|---|---|---|
| 4,600,137 A | | 7/1986 | Comerford ................... 228/102 |
| 4,725,716 A | * | 2/1988 | Entwistle et al. ........... 156/276 |
| 4,771,929 A | | 9/1988 | Bahr et al. ................... 228/102 |
| 4,775,776 A | * | 10/1988 | Rahn et al. .................. 219/388 |
| 4,915,624 A | | 4/1990 | Mittelstadt ................... 432/59 |
| 5,003,160 A | * | 3/1991 | Matsuo et al. ............... 219/494 |
| 5,039,841 A | * | 8/1991 | Kato et al. ................... 219/388 |
| 5,060,288 A | * | 10/1991 | Spigarelli et al. ........... 392/412 |
| 5,128,506 A | * | 7/1992 | Dahne et al. ............. 219/85.13 |
| 5,196,667 A | * | 3/1993 | Gammelin ................ 219/85.12 |
| 5,358,166 A | * | 10/1994 | Mishina et al. ................ 228/42 |
| 5,433,368 A | * | 7/1995 | Spigarelli ....................... 228/8 |
| 5,560,531 A | * | 10/1996 | Ruszowski .................... 228/19 |
| 5,573,174 A | * | 11/1996 | Pekol .......................... 228/219 |
| 5,573,688 A | * | 11/1996 | Chanasyk et al. ........... 219/388 |
| 5,627,913 A | * | 5/1997 | Spigarelli et al. ........... 382/151 |
| 6,135,344 A | * | 10/2000 | Sakuyama et al. ....... 228/234.1 |
| 6,275,750 B1 | * | 8/2001 | Uchida et al. .............. 700/300 |
| 6,334,569 B1 | * | 1/2002 | Yoshimura ............... 228/180.1 |
| 6,644,536 B2 | * | 11/2003 | Ratificar et al. ......... 228/234.1 |

FOREIGN PATENT DOCUMENTS

| | | | |
|---|---|---|---|
| EP | 0279604 A2 | * | 8/1988 |
| EP | 0461961 A1 | * | 12/1991 |
| EP | 0802010 A1 | * | 10/1997 |
| JP | 05-285641 A | * | 4/1992 |

* cited by examiner

*Primary Examiner*—L. Edmondson
(74) *Attorney, Agent, or Firm*—Lowrie, Lando & Anastasi, LLP

(57) ABSTRACT

A reflow soldering apparatus and method are provided for reflow soldering electrical and electronic components to circuit boards. The reflow soldering apparatus and method use selective infrared (IR) heating alone or in combination with convection heating to achieve reflow soldering. Selective IR heating provided by the apparatus and method according to the invention helps to eliminate or helps to at least substantially reduce a risk overheating and thermal damage to non-targeted electrical and electronic components and areas of circuit boards during reflow.

37 Claims, 10 Drawing Sheets

REFLOW SOLDERING APPARATUS AND METHOD FOR SELECTIVE INFRARED HEATING

FIELD OF THE INVENTION

The invention is generally directed to a reflow soldering apparatus and method. More particularly, a reflow soldering apparatus and method are provided for selective infrared radiant heating alone or in combination with convection heating for solder mounting electrical and electronic components to surfaces of circuit boards.

BACKGROUND OF THE INVENTION

Reflow soldering systems provide high volume soldering of surface mount electronic components to circuit boards and other electronic substrates using radiant and convection heating. Many reflow soldering techniques have a tendency to overheat components, causing thermal damage to heat-sensitive and small components. Use of convection heating in conjunction with radiant heating helps to reduce the risk of overheating components due to the thermal leveling effect provided, in part, by convection heating. The combination of convection and radiant heating, however, does not address the problem of uniformly heating components of different sizes on a single circuit board. As the size differential between individual components and circuit boards increases, heating components to a substantially uniform temperature becomes more difficult. Flip chip designs, such as cell phone and optical communications chips, have higher heat outputs on the order of approximately 80 watts/cm$^2$ in comparison to other components, such as integrated circuits, having heat outputs of approximately 2 watts/cm$^2$. These flip chip designs often require the attachment of heat sinks in order to dissipate the substantial heat output, which increases the overall size of the flip chip components. Reflow soldering systems and techniques that use a combination of convection heating and radiant heating, provided as infrared (IR) heat, are susceptible to overheating or under heating large components.

In addition, use of lead-free solders in surface mount applications requires precision in controlling the temperatures of components and circuit boards to the desired ranges of temperatures in the various phases of reflow soldering. In particular, lead-free solders often require high melting temperatures and narrow process windows between the peak temperatures required just below the desired reflow temperature and the liquidous temperatures required to reflow solder. Lead-free soldering, thus, requires accurate temperature control and heating of components and circuit boards.

Therefore, it is desirable to provide an improved reflow soldering apparatus and method using a combination of infrared radiant heating and convection heating, whereby control of narrow ranges of temperatures is achieved and surface mount components of different sizes are substantially uniformly heated to within desired ranges of temperatures during the reflow soldering process. It is desirable to provide a reflow soldering apparatus and method with efficient overall performance providing energy savings and high process throughput.

SUMMARY OF THE INVENTION

An object of the invention is to provide an improved reflow soldering apparatus and method. Another object of the invention is to provide an infrared heating assembly for selective infrared heating.

In general, in an aspect, the invention provides a reflow soldering apparatus for soldering one or more components to a circuit board comprising a housing having a conveyor to convey the circuit board through the housing, at least one heating zone disposed in the housing, and at least one infrared heater disposed in the heating zone. The at least one infrared heater is spaced from the conveyor to heat one or more of the components disposed on the circuit board as the circuit board is conveyed through the heating zone, and is disposed and configured to selectively heat one or more of the components as they are conveyed through a line-of-sight of the at least one infrared heater.

Implementations of the invention may include one or more of the following features. The apparatus can further comprise at least a second infrared heater, the second infrared heater being spaced from the conveyor to heat one or more of the components disposed on the circuit board as the circuit board is conveyed through the heating zone, and being disposed and configured to selectively heat one or more of the components as they are conveyed through a line-of-sight of the at least one infrared heater. The at least one infrared heater is located above the conveyor, or, alternatively, the at least one infrared heater is located below the conveyor. The apparatus can further comprise at least one side infrared heater spaced being spaced from the conveyor to heat one or more of the components disposed on the circuit board as the circuit board is conveyed through the heating zone, the at least one infrared heater being disposed and configured to selectively heat one or more of the components as they are conveyed through a line-of-sight of the at least one infrared heater.

Implementations of the invention may further include one or more of the following features. The apparatus can comprise a control system operatively coupled to the apparatus to control operation of the at least one infrared heater. The control system can include a programmable controller to control operation of the at least one infrared heater. The programmable controller can include at least one stored variable. The apparatus can further comprise at least one sensor disposed in the heating zone, the at least one sensor being configured to detect at least one variable of operation of the heating zone such that when the sensor detects the at least one variable, the sensor sends a signal to the programmable controller, and the programmable controller, in response to receipt of the signal, controls the operation of the at least one infrared heater. The programmable controller can selectively control the operation of the at least one infrared heater. The apparatus can further include a temperature sensor that detects a temperature in the heating zone such that the sensor sends a signal to the programmable controller corresponding to the temperature and the programmable controller, in response to receipt of the signal, controls the operation of the at least one infrared heater. The programmable controller can compare the signal sent by the temperature sensor to at least one stored variable to selectively operate the at least one infrared heater. The apparatus can include an optical sensor that detects the circuit board in the heating zone such that the sensor sends a signal to the programmable controller corresponding to detection of the circuit board and the programmable controller, in response to receipt of the signal, controls the operation of the at least one infrared heater. The programmable controller can compare the signal sent by the optical sensor to at least one stored variable to selectively operate the at least one infrared heater.

The apparatus can include at least one infrared heater disposed in an array of infrared heaters. The apparatus can further include the at least one infrared heater disposed in a linear array of infrared heaters, the linear array being disposed and configured to extend above and across the conveyor in a substantially perpendicular orientation to a direction in which the conveyor conveys the circuit board.

These and other advantages of the invention, along with the invention itself, will be more fully understood after a review of the following figures, detailed description, and claims.

DETAILED DESCRIPTION OF THE INVENTION

Illustrative embodiments of the invention described herein provide an apparatus and method for reflow soldering electrical and electronic components to substrate boards. More particularly, a reflow soldering apparatus and method are provided for use in surface mount applications to join electrical and electronic components to one or more surfaces of circuit boards by reflow soldering. The reflow soldering apparatus and method employ a combination of selective infrared (IR) radiant heating and convection heating to achieve solder reflow. The reflow soldering apparatus and method is an improvement of prior art reflow soldering systems that employ a combination of radiant and convection heating, such as those disclosed in U.S. Pat. Nos. 4,771,929 and 4,600,137, which are incorporated herein by reference. Other embodiments of the reflow soldering apparatus and method are within the scope of the invention.

Embodiments are described with reference to FIGS. 1–9, which are presented for the purpose of illustrating embodiments and are not intended to limit the scope of the claims. As used herein, the term "components" refers to surface mount electrical and electronic components including integrated circuits, small, thin chips, flip chips and the like, as well as carriers therefor. The terms "top" and "bottom" as used herein refer to the spatial orientation of a circuit board to sources of IR and convection heat as the circuit board is conveyed through a reflow soldering method and apparatus. The terms "reflow soldering" and "mass reflow soldering" refer to a soldering technique well known in the art, wherein solder is preapplied in a preferred form with components to a circuit board, heated to reflow temperature, and subsequently cooled to form mechanical joints and electrical interconnections between the components and circuit board.

Figure 1:
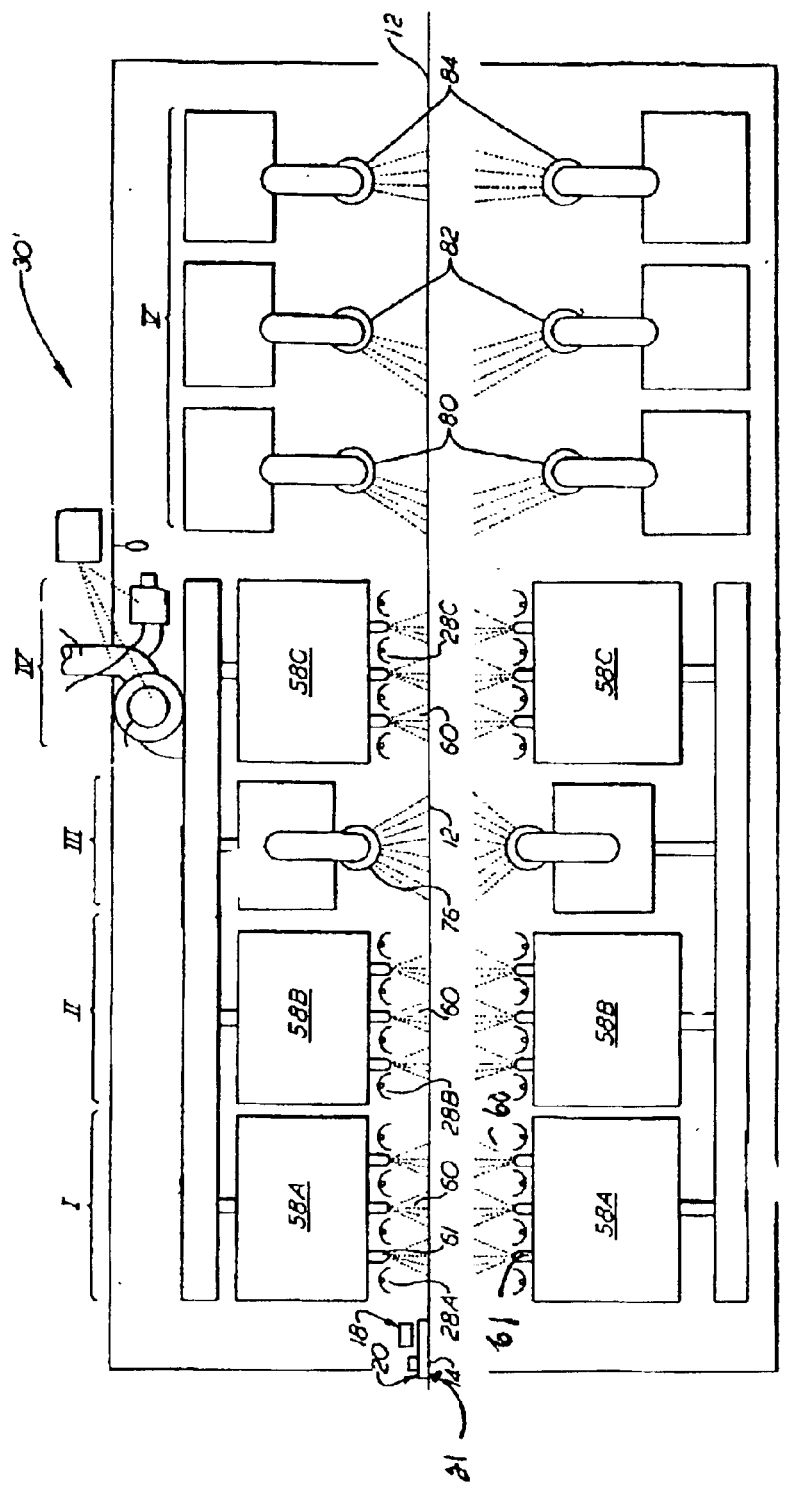
FIG. 1 is a side elevational view of a prior art reflow soldering system.

A reflow soldering apparatus can include a combination of infrared (IR) heating and convection heating similar to a prior art reflow soldering system 30' diagrammatically illustrated in FIG. 1. The reflow soldering apparatus 30' of FIG. 1 provides reflow soldering of electrical and electronic components to circuit boards in-line by employing a combination of IR and convection heating in a plurality of heat management zones. As shown in FIG. 1, the plurality of heat management zones includes zones I, II, III, IV and V, wherein zones I, II and III are preheating zones and zones IV and V are peak heating zones. The preheating and peak heating zones control heating and the temperature of components 18 disposed on a top surface 20 of a circuit board 14 as the circuit board 14 is conveyed by a continuous conveyor 12 through the plurality of heat management zones. The plurality of heat management zones heats the components 18 and the circuit board 14 to desired preheat and reflow temperatures by maintaining an increasing temperature ramp as the circuit board 14 passes through each of the heat management zones. The increasing temperature ramp raises the temperature of the components 18 and circuit board 14 at a predetermined rate or slope such that the increasing temperatures of the components 18 and the circuit board 14 are allowed to level or stabilize to minimize any temperatures differences between the components 18 and the circuit board 14. The thermal leveling allows the components 18 and the circuit board 14 to be substantially uniformly heated and helps avoid overheating and/or under heating of individual components 18 and/or areas of the circuit board 14.

Preheating zones I, II, and III control the temperature of the components 18 and the circuit board 14 by increasing the temperature ramp to a desired preheat temperature as the circuit board 14 is conveyed through each of the preheating zones. Each of the preheating zones heats the components 18 and the circuit board 14 to a desired temperature by employing infrared (IR) heating, convection heating or a combination thereof. For instance, as disclosed in U.S. Pat. No. 4,771,929, preheating zone I primarily employs IR heating sources 28A to warm the cold components 18 and circuit board 14 as they enter the soldering apparatus 30' and are conveyed through preheating zone I. Preheating zone II employs a combination of IR heating sources 28A supplemented with convection heating sources 58B to maintain the increasing temperature ramp and to, in part, level or stabilize the temperature differences between the components 18 of different sizes disposed on the circuit board 14. Preheating zone III employs convection heating sources 58C supplemented optionally with IR heating sources 28C to contribute to the increasing temperature ramp and to further the leveling of the temperature difference between the components 18 and the circuit board 14.

Peak heating zones IV and V primarily employ convection heating to increase the temperature of the components 18 and the circuit board 14 to a desired reflow temperature. Peak heating zone IV increases the temperature of the components 18 and circuit board 14 to a temperature just below the desired reflow temperature, while peak heating zone V increases the temperature rapidly to a temperature just above the desired reflow temperature in order for solder to reflow.

As shown in FIG. 1, the IR heating sources 28A, 28B and 28C employed in preheating zones I, II and III of the prior art reflow soldering system 30' include one or more banks of quartz lamp, high mass type IR heaters, which are conventionally employed as IR preheaters. The banks of IR heaters 28A, 28B and 28C are typically disposed above the conveyor 12, and, optionally, below the conveyor 12, to provide IR heating to the top surface 20 and a bottom surface 21 of the circuit board 14 and the components 18 mounted thereon. The banks of IR heaters 28A, 28B and 28C are arranged between the sources of convection heating, which are, in the case of the prior art reflow soldering system of FIG. 1, air supply plenums 58A, 58B and 58C. Air supply plenums 58A, 58B and 58C provide convection air by a plurality of upwardly and downwardly facing air nozzles 61 that flow hot air 60 across the circuit board 14 and the components 104 mounted thereon. The banks of IR heaters 28A, 28B and 28C are independently operable and include independent feedback control to separately control each bank. Similarly, the temperature and flow rate of the convection air may be separately controlled by the air plenums 58A, 58B and 58C.

Figure 2:
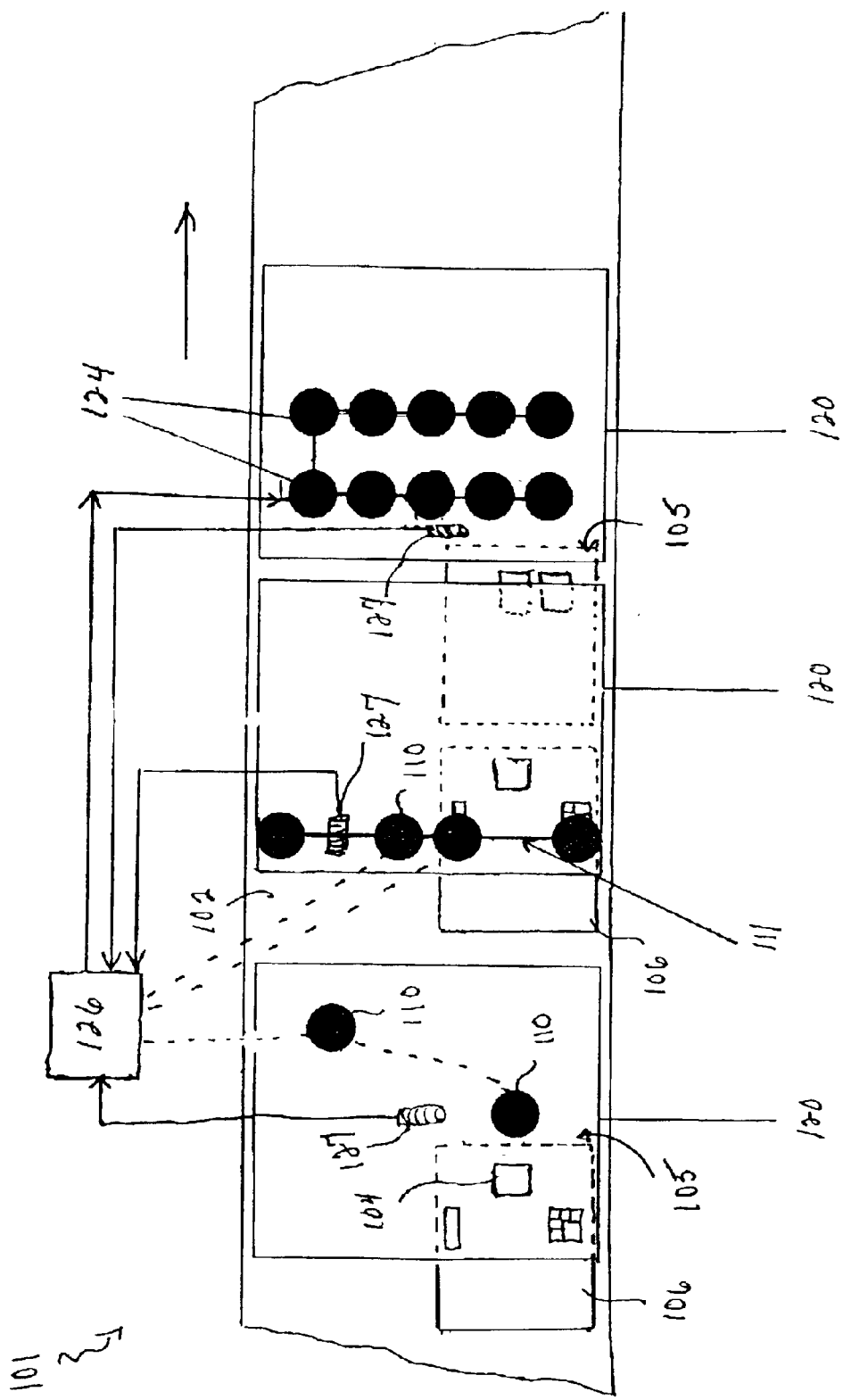
FIG. 2 is a top view of a first embodiment of a reflow soldering apparatus according to the invention.

Referring to FIG. 2, a schematic top view of a first embodiment according to the invention is illustrated. A reflow soldering apparatus 101 is provided comprising an infrared (IR) radiant heating assembly that can be used in a combination of IR heating and convection heating. The IR heating assembly provides selective IR heating and can be used in a reflow soldering system similar to the reflow soldering system 30' described in reference to FIG. 1. In one embodiment, the selective IR heating assembly comprises a sole source of IR heating of the reflow soldering system to selectively heat the circuit board 14 and/or one or more components 104 mounted to a surface of the circuit board. In another embodiment, the selective IR heating assembly comprises a second source or a supplemental source of IR heating of the reflow soldering system used in conjunction with other IR heat sources disposed in the reflow soldering system.

The reflow soldering apparatus 101 contains the selective IR heating assembly comprising at least one IR heat source 110 disposed in one or more heat management zones 120 of the apparatus 101. The IR heat source 110 is disposed at a desired location above and/or below (not shown) a continuous conveyor 102 in at least one of the heat management zones 120 to permit the IR heat source 110, when operational, to heat one or more targets 104 disposed on the conveyor as the conveyor conveys the one or more targets 104 through the heat management zone 120. A target may include, for example, a single electronic component or an array of closely spaced electronic components mounted on a surface of a circuit board 106 as the circuit board 106 is conveyed on the continuous conveyor 102 through the heat management zone 120. As shown in FIG. 2, a multiple of IR heat sources 110 are disposed above and/or below (not shown) the conveyor 102 within each of the heat management zones 120.

The multiple of IR heat sources 110 can be arranged in a number of different arrangements above and/or below the conveyor in one or more of the heat management zones 120. The IR heat sources 110 can be arranged in a matrix 124. For example, the IR heat sources 110 can be arranged in a matrix with IR heat sources 110 positioned along an X-axis and a Y-axis to configure an X-Y matrix 124 of IR heat sources 110. The IR heat sources 110 also can be arranged as a bank or a liner array of IR heat sources 111. In one embodiment, the bank or the linear array of IR heat sources 111 can traverse the conveyor in a substantially perpendicular orientation to a direction in which the conveyor conveys the one or more targets 104. In addition, individual IR heat sources 110 can be arranged separately or in an array in one or more of the heat management zones 120.

Figure 3:
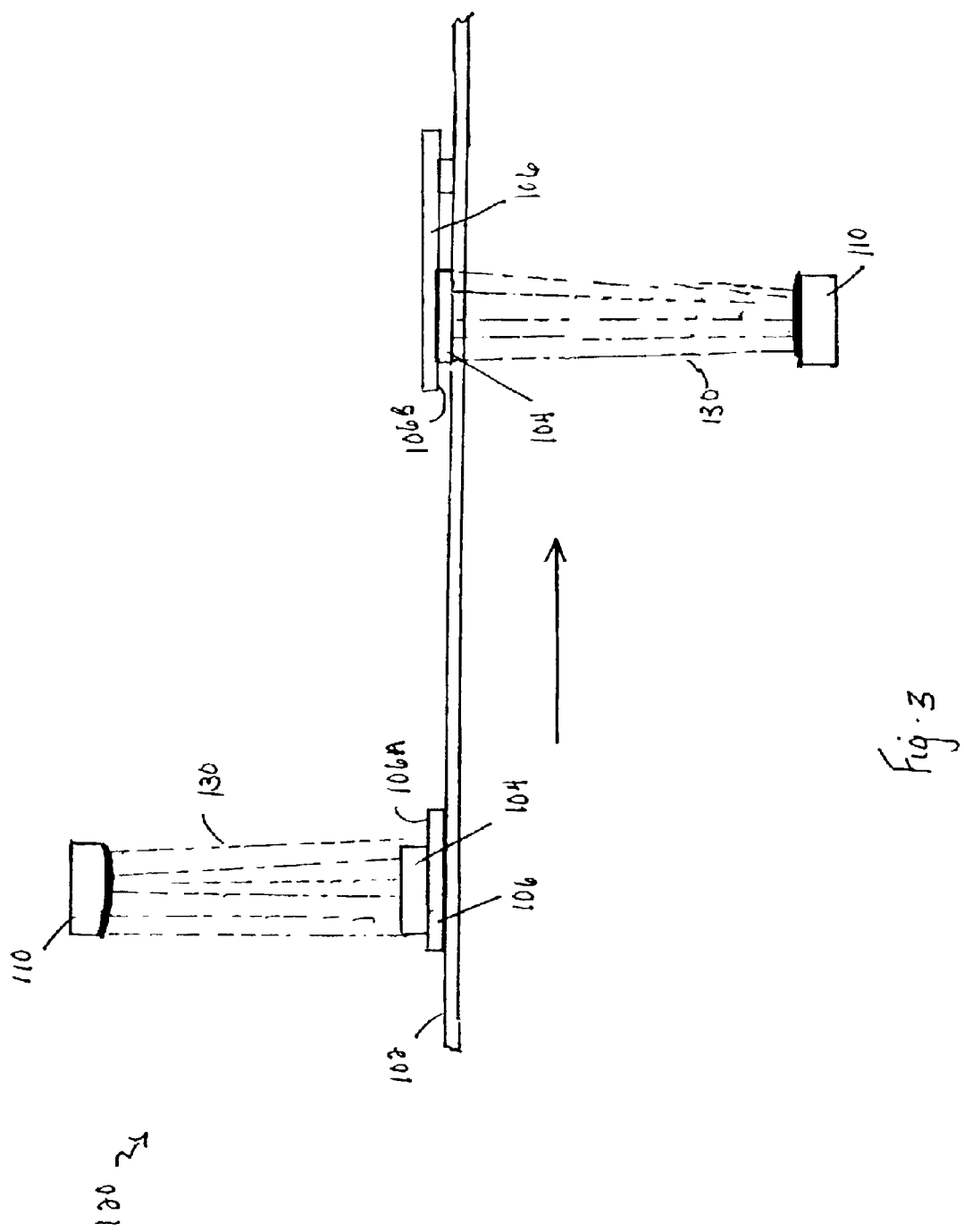
FIG. 3 is a side elevational view of the first embodiment.

Referring to FIGS. 2 and 3, a location of each of the IR heat sources 110 above and/or below the conveyor 102 in one or more of the heat management zones 120 is empirically determined to correspond to a position of one or more the targets 104 mounted on a top surface 106A or a bottom surface 106B of the circuit board 106. This may be accomplished by an operation determining the position a particular target 104 will occupy in an X-Y plane as the circuit board 106 passes below (or above) the one or more heat sources 110. Manually moving the heat sources 110 within the heat management zone 120 and fixing the heat source 110 in place may do this.

In one embodiment, locating the IR heat sources 110 may be accomplished more or less automatically under computer control. For example, the matrix 124 of IR heat sources 110 may be controllable to turn on and off through suitable connections to a controller 126 such as a PC-type computer. An operator may be able to determine which one or which ones of IR heat sources 110 of the X-Y matrix correspond in position to a particular target or targets 104 and program the PC 126 to turn on that or those IR heat sources 110 when appropriate while the other IR heat sources 110 remain turned off.

Further, since it is common in the industry for there to be a CAD rendering of a circuit board positioning of components, the PC 126 may be programmed so that one or more targets 104 are selected for heating by the IR heat sources 110. Thus, under control of the PC 126, selected IR heat sources 110 are turned on to correspond in an X-Y plane to the position of target or targets 104.

Each IR heat source 110, therefore, is optimally located such that as the circuit board 106 is conveyed through the heat management zone 120, the target 104 is conveyed directly through a line-of-sight of each IR heat source 110. The target 104 receives a significant portion or substantially all of the IR radiation 130 emitted from the IR heat source 110 during the interval in which the target 104 passes through the line-of-sight of the IR heat source 110.

In one embodiment, a controller 126 of a type well known in the art such as a programmed PC, is operatively connected or communicatively coupled to the reflow soldering apparatus to control the operation of the IR heat sources 110. The controller 126 controls the IR heat sources 110 by programming, measuring or monitoring a number of variables or predetermined values related to a reflow process to operate the IR heat sources 110. The controller 126 controls and adjusts the IR heat sources 110, e.g., turns on the IR heat sources 110, turns off the IR heater sources 110, and turns on one or more of the IR heat sources 110 for a period of time. The variables or predetermined values help to adjust and control the reflow process to achieve and maintain optimum reflow conditions and may include, although are not limited to, time intervals to control a duration of operation of the IR heat source 110, conveyance speeds to control a speed at which the target 104 is conveyed through the line-of-sight of the IR heat source 110, activation or turning on of the IR heat source on recognition of the target 140 approaching the line-of-sight of the IR heat source 110, and present state temperatures of one or more heat management zones 120. One or more sensors or measuring and/or monitoring devices 127 well known in the art, e.g., temperature sensors, optical sensors, speed tachometers, may be disposed in one or more heat management zones to detect, measure and/or monitor variables and predetermined values to determine one or more conditions of the reflow process. The sensors and measuring and monitoring devices 127 are operatively connected or communicatively coupled to the controller to transmit electrical or other signals to the controller on detection, measurement and/or monitoring of one or more of the variables and/or the predetermined values. In response to the electrical or other signals, the controller 126 is programmed and operable to control and adjust the IR heat sources 110 in response to one or more conditions of the reflow process.

In addition, the controller 126 is operable to control the operation of individual infrared heat sources 110 separately and independently from the remaining heat IR sources 110, and operable to control the operation of a number of the IR heat sources 110 simultaneously. The controller is also operable to control the selective IR heat sources 110 in conjunction with other IR heat sources and/or other heat sources, e.g., convection heat sources, disposed in one or more heat management zones of the system.

In one embodiment, the controller 126 may activate or turn on one or more selective IR heat sources 110 to emit IR radiation just prior to the target 104 entering the line-of-sight of one of the IR heat sources 110 and thereafter to deactivate or shut off each IR heat source 110 after the target 104 is conveyed through and beyond the line-of-sight of the IR heat source 110. For example, a sensor may include an optical line-of-sight sensor 127 that detects an edge of the circuit board 106 as it approaches the heat management zone 120. Upon detection of a forward edge 105 of the board 106, the controller 126, which has been programmed, will cause the one or more heat sources 110 to be activated at a time determined by such factors as conveyor belt speed, latency time for the heat source to come to full heat force and other similar factors.

Thus, as an example, and utilizing the X-Y matrix 124 of IR heat sources 110, as the circuit board 106 is conveyed by the conveyor 102, a forward or leading edge 105 of the circuit board 106 is detected and the sensor 127 sends a signal to controller 126 to indicate sight of the circuit board 106. Since the controller 126 has been preprogrammed to know the type of circuit board 106 being heated and its configuration with respect to the components disposed on its surface(s), the controller 126 will send out signals, in a manner well known in the art, to turn on (and later turn off) selected IR heat sources 110. Upon detection of the next circuit board 105 in line on the conveyor 102, the above procedure repeats itself.

In one embodiment, the controller 126 may activate or turn on one or more selective IR heat source 110 to emit IR radiation to adjust a temperature in a heat management zone 120 to a desired temperature. For example, a temperature sensor 127 disposed in a heat management zone 120 may transmit a signal to the controller in response to detection of a temperature in the heat management zone. On receipt of the signal from the sensor, the controller determines if the temperature detected in the heat management zone is a desired temperature or within a range of a desired temperature. If detected temperature is not the desired temperature of within the range of the desired temperature, the controller sends one or more signals to one or more IR heat sources 110 in the heat management zone to adjust, e.g., increase or decrease, the temperature in the heat management zone.

Other embodiments of the invention using the controller 126 to control operation of the selective IR heating assembly are not limited and may control other operation arrangements and configurations as required to optimize reflow soldering conditions and to accommodate a type and number of circuit boards 106 and targets 104 requiring reflow soldering.

The selective IR heating assembly helps to at least substantially restrict or target IR radiation 130 emitted from the IR heat source 110 to the target 104 and to thereby help at least substantially reduce or eliminate IR radiation 130 directed against non-targeted components and/or areas of the circuit board 106 surrounding the target 104. Selective IR heating may restrict IR radiation, for instance, to only large components targeted due to their relative size and large heat capacities, requiring greater exposure to radiant heat in order to reach the desired preheat and reflow temperatures. Selectively heating large target components 104 with the IR heat source 110 positioned at optimal locations above and/or below the conveyor 102 provides sufficient to large target components 104, while eliminating or at least substantially reducing the possibility of thermal damage to non-targeted components and areas of the circuit board due to overheating and/or thermal shock.

Figure 4:
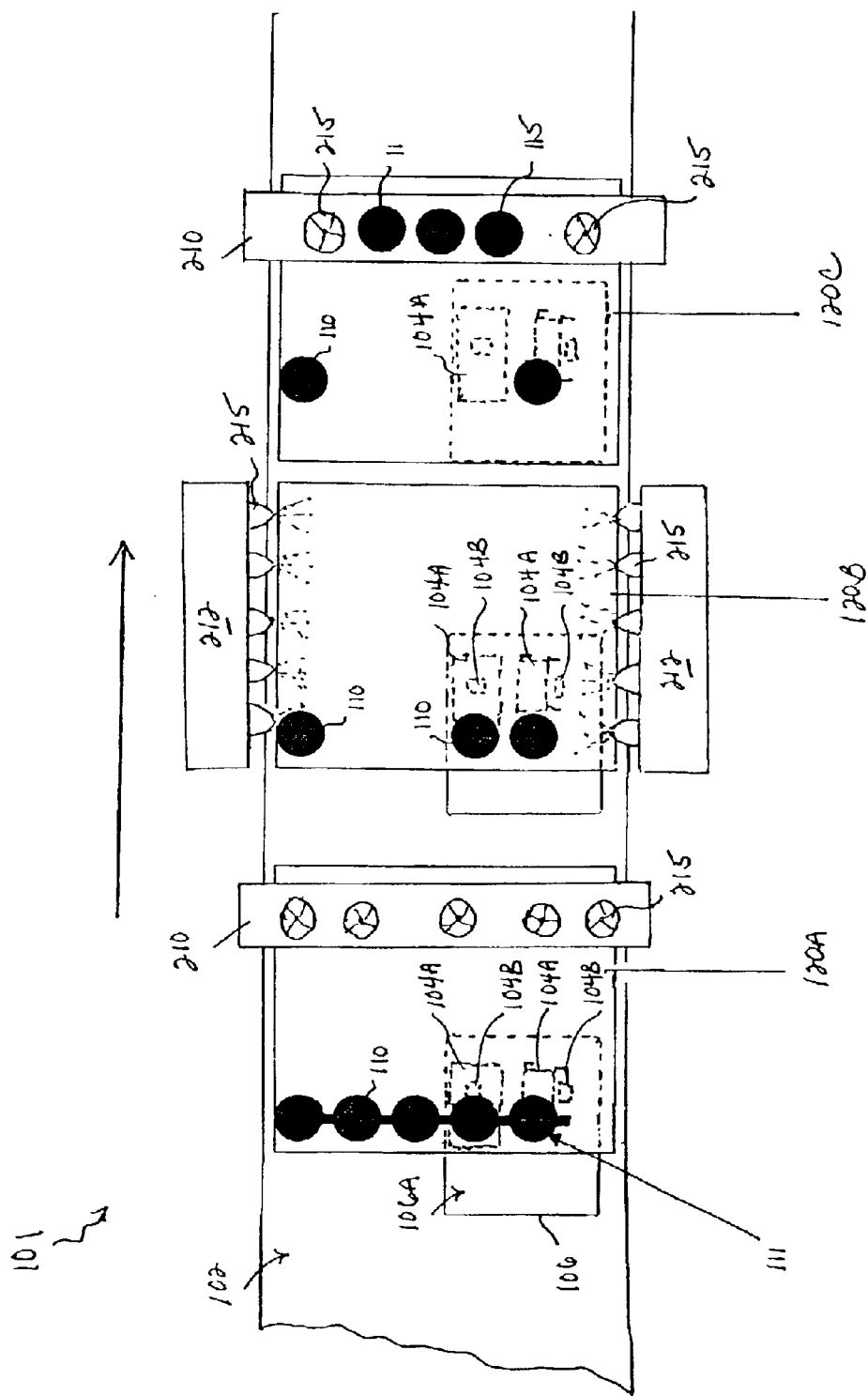
FIG. 4 is a top view of a first version of the first embodiment illustrating preheating zones.
Figure 5:
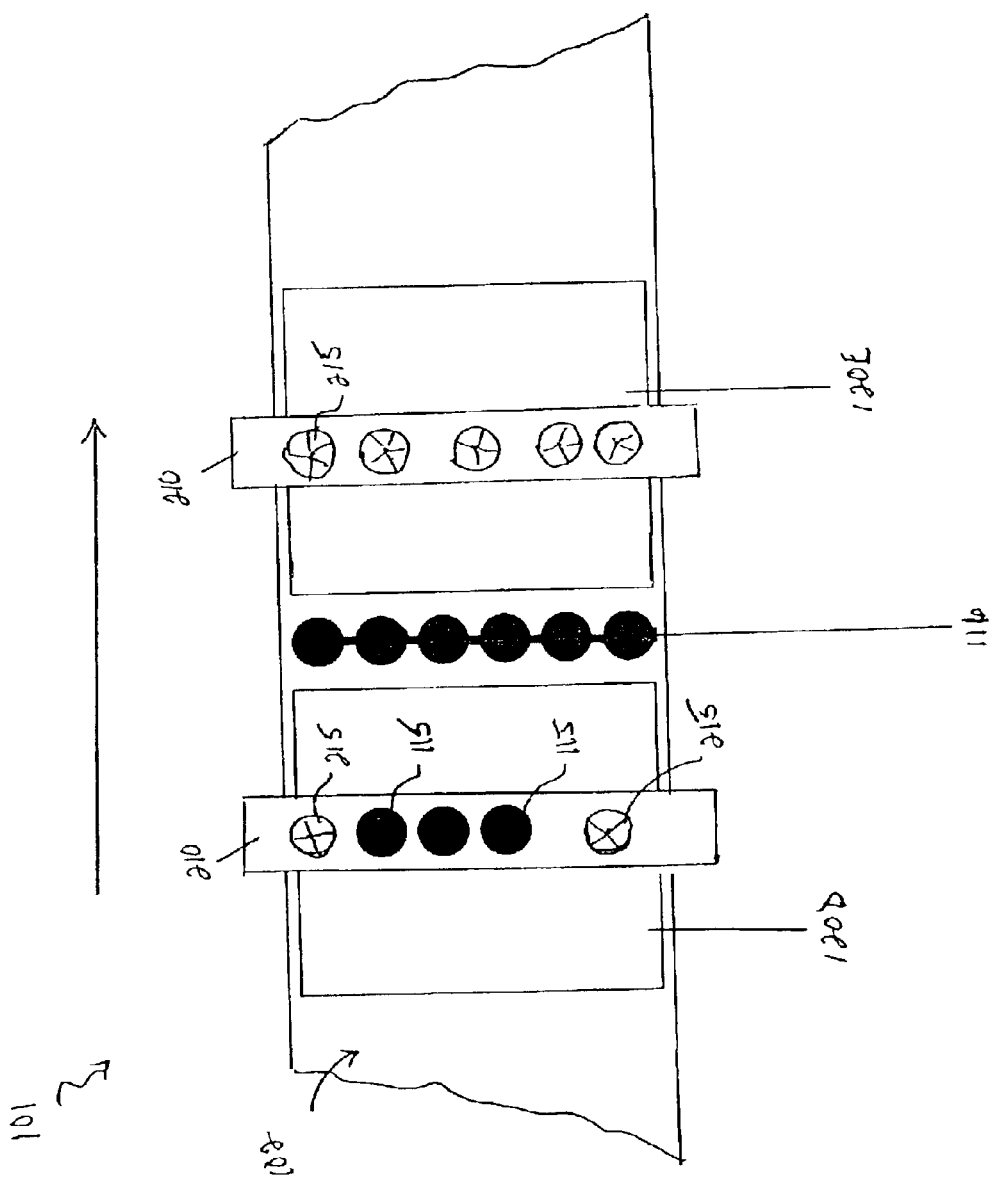
FIG. 5 is a top view of the first version of the first embodiment illustrating peak heating zones.
Figure 5A:
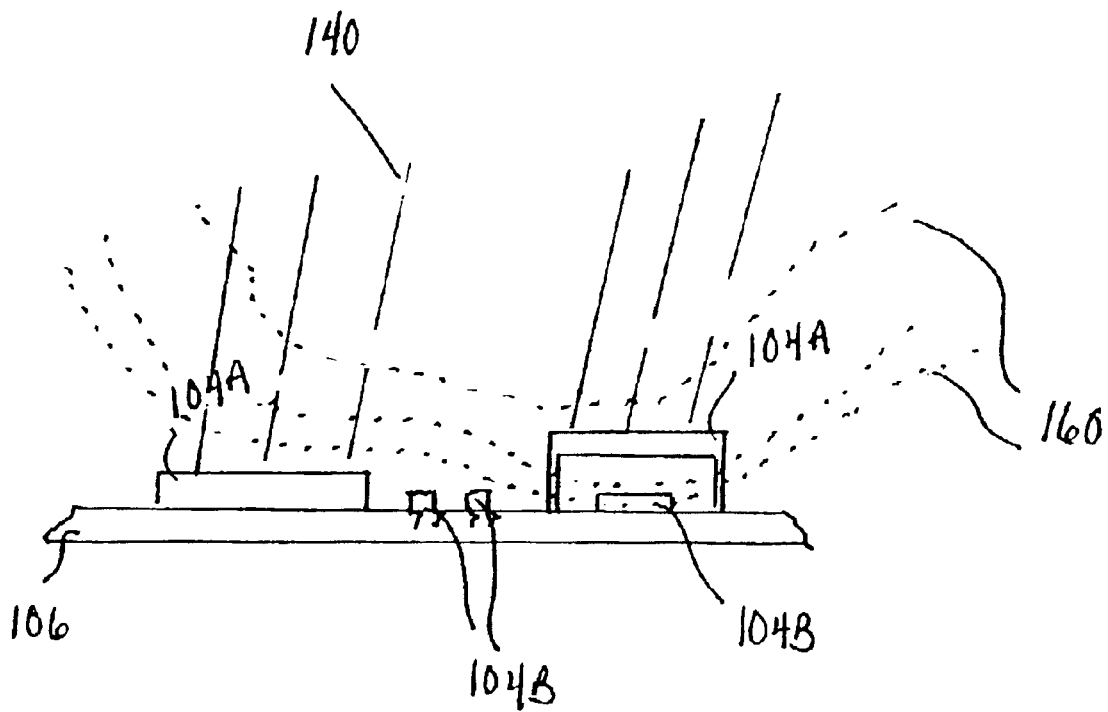
FIG. 5A is a schematic drawing illustrating the effects of radiant and convection heating according to the invention.

Referring to FIGS. 4, 5 and 5A, in one version of the first embodiment according to the invention, the combination of selective IR heating and convection heating of the reflow soldering apparatus 101 comprises a plurality of quartz lamp, high mass type IR heaters 110 employed as the selective IR heat sources. The quart lamp IR heaters 110 are positioned at predetermined locations within the heat management zones 120A, 120B, 120C, 120D and 120E as either a bank of IR heaters 111 or an array of individual IR heaters 110. The bank of IR heaters 111 or array of individual IR heaters 110 may be interspersed with a plurality of gas supply plenums or gas diffusers 210 disposed above and/or below (not shown) a continuous conveyor 102 and/or at opposing sides 212 of the conveyor 102 to provide convection heating. Each of the gas diffusers 210 and 212 includes a plurality of upwardly, downwardly or laterally facing gas delivery nozzles 215 that flow hot gas against the top and bottom surfaces as well as the sides of a circuit board 106 to heat components 104A and 104B mounted thereon. The arrangement and placement of the gas diffusers 210 and 212 and the IR heaters 110 and 111 within each of the heat management zones 120A, 120B, 120C, 120D and 120E depends upon the temperature requirements of each zone and the type and size of the components 104A and 104B to be reflow soldered to the circuit board 106.

As shown in a top view of the reflow soldering apparatus 101 of FIG. 4, a first preheating zone 120A may employ a bank of IR heaters 111 and a gas diffuser 210 with a plurality of gas nozzles 215 to flow hot gas, typically air supplied from a source external to the reflow soldering apparatus 101, against a top surface 106A of the circuit board 106 as the circuit board 106 is conveyed through the first preheating zone 120A on the conveyor 102. Although air is employed as the hot gas in the first embodiment to provide convection heating, other gases or vapor fluids, e.g., nitrogen gas in applications requiring such gas, as well known in the art may be heated and circulated throughout the heat management zones 120A, 120B, 120C, 120D and 120E, according to the invention, to provide convection heating. The first preheating zone 120A may also employ a bank of IR heaters 111, an array of individual IR heaters 110 and/or a gas diffuser 210 disposed below the conveyor 102 to heat components mounted to a bottom surface (not shown) of the circuit board 102.

The first preheating zone 120A increases the temperature of the circuit board 106 and the components 104A and 104B to a desired preheat temperature employing the combination of selective IR and convection heating to continuously increase or ramp the temperature of the circuit board 106 and the components 104A and 104B. The temperature differences between individual components 104A and 104B and the circuit board 106 are allowed to level or stabilize as the circuit board 106 is conveyed through the first preheating zone 120A. As the temperature differences between the components 104A and 104B and circuit board 106 are substantially minimized, the components 104A and 104B and the circuit board 106 become substantially uniformly heated to the desired preheat temperature. The circuit board 106 then passes at the desired preheat temperature from the first preheating zone 120A into a second preheating zone 120B.

As is well known in the art, convection heating is used in combination with radiant heating in reflow soldering systems and methods to provide, in part, the thermal leveling or stabilizing of temperature differences between individual components and circuit boards. In particular, convection heating helps sufficiently heat small and low profile components either nested within larger components or shadowed by components having higher profiles and thereby prevented from receiving sufficient radiant heat. For instance, in the first preheating zone 120A, the bank of IR heaters 111 selectively heats large and high profile components 104A by targeting IR radiation against such components 104A as they are conveyed through the line-of-sight of the bank of IR heaters 111, while the gas diffuser 210 flows and recirculates hot air across and around small and low profile components 104B removed from the line-of-sight of the IR heaters 111. As shown in FIG. 5A, IR radiation 140 is emitted by the IR heaters 110 and 111 primarily against the large and high profile components 104A targeted for selective IR heating, while the flow of convective hot air 160 provided by the gas diffusers 210 and 212 circulates among all components including the small and low profile components 104B prevented from receiving IR radiation.

The circulating convective hot air effectively lowers the temperature of the large and high profile components 104A having high IR absorption rates, while increasing the temperature of the small and low profile components 104B to help achieve thermal leveling and reduce or substantially minimize temperature differences between individual components 104A and 104B and the circuit board 106. Selective IR heating of targeted components, particularly the large and high profile components 104A, helps to substantially reduce the time in which the thermal leveling is accomplished and thereby increases the efficiency with which the first preheat management zone 120A warms up the cold components 104A and 104B and the circuit board 106 to the desired preheat temperature. Selective IR heating also prevents overheating and thermal damage to the circuit board 106 as well as heat-sensitive, small or low profile components 104B.

As shown in FIG. 4, a second preheating zone 120B may employ gas diffusers 212 disposed at opposing sides of the conveyor 102 to provide convection heat to components (not shown) mounted to sides of the circuit board 106 as the circuit board 106 is conveyed through the second preheating zone 120B. The second preheating zone 120B may also include an array of individual IR heaters 110 optimally positioned at predetermined locations according to the invention above and/or below (not shown) the conveyor 102. The predetermined positions of individual IR heaters 110 directly correspond to the sites of the large and high profile components 104A on the circuit board 106 targeted to receive IR radiation. Each IR heater 110 provides IR radiation against the large and high profile target components 104A as the circuit board 106 conveys the target components 104A through the line-of-sight of each IR heater 110. The IR heaters 110 maintain the increasing temperature ramp of the large and high profile components 104A, while the gas diffusers 212 provide convective hot air to lower the temperature of the large and high profile components 104A and raise the temperature of small and low profile components 104B. The overall heating effect maintains the increasing temperature ramp and the thermal leveling between individual components 104A and 104B and the circuit board 106 to substantially uniformly heat the components 104A and 104B and the circuit board 106 to the desired preheat temperature of the second preheating zone 120B.

A third preheating or "soak" zone 120C may similarly employ IR heaters 110 as either a bank of IR heaters 111 or an array of individual IR heaters 110 positioned above and/or below (not shown) the conveyor 102, as shown in FIG. 4. As in the first and second preheating zones 120A and 120B, the IR heaters 110 are optimally positioned at predetermined locations directly corresponding to the sites of the large and high profile target components 104A and 104B on the circuit board 106. In addition, IR heaters 115 may be embedded in one or more of the gas diffusers 215 disposed in any of the heat management zones 120A, 120B, 120C, 120D and 120E to provide the combination of IR and convection heating according to the invention. The IR heaters 115 disposed in the gas diffuser 215 similarly provide IR radiation directly against the large and high profile target components 104A as they are conveyed within the line-of-sight of the IR heaters 115. The combination of selective IR heating and convection heating "soaks" the components 104A and 104B and the circuit board 106 to substantially contribute to the increasing temperature ramp and further the thermal leveling between the components 104A and 104B and the circuit board 106.

Referring to FIG. 5, after the circuit board 106 is conveyed through the first, second and third preheating zones 120A, 120B and 120C, the increasing temperature ramp is substantially increased or spiked to a desired temperature just below the desired reflow temperature in a fourth heat management zone or a "spike" heating zone 120D. IR heaters may be similarly employed as either a bank of IR heaters 111, an array of individual IR heaters 110 or, as shown in FIG. 5, IR heaters 115 embedded in a gas diffuser 210 to rapidly increase the temperature of the components 104A and 104B and the circuit board 106 to the desired spike temperature. The components 104A and 104B and the circuit board 106 are subsequently conveyed into a fifth and final reflow heating zone 120E, wherein the temperature of the components 104A and 104B is rapidly increased to a temperature just above the desired reflow temperature in order for solder to reflow. The rapid increase from the spike temperature to just above the desired reflow temperature may be achieved, for instance, by employing a bank of IR heaters 116 disposed above and/or below (not shown) the conveyor 102 between the spike and reflow heating zones 120D and 120E, as shown in FIG. 5. The bank of IR heaters 116 may provide sufficient IR radiation to all components 104A and 104B and the circuit board 106 for a relatively short interval required to sufficiently spike the temperature of the components 104A and 104B and circuit board 106 to a temperature just above the desired reflow temperature. A gas diffuser 210 may also be employed in the fifth reflow heating zone 120E, as shown in FIG. 5, to provide convective hot air for effective thermal leveling of the temperature of the components 104A and 104B and the circuit board 106 during solder reflow to eliminate or at least substantially reduce the possibility of thermal damage to the components 104A and 104B and circuit board 106 at reflow temperature.

As shown in FIGS. 4 and 5, the large and high profile target components 104A are selectively heated to the desired preheat and reflow temperatures from two or more exposures to IR radiation as the large and high profile components 104A are conveyed through the heat management zones 120A, 120B, 120C, 120D and 120E. While the IR heaters of the first embodiment of FIGS. 4 and 5 are disposed in each of the heat management zones 120A, 120B, 120C, 120D and 120E as an array of individual IR heaters 110, a bank of IR heaters 111, IR heaters 115 embedded in a gas diffuser 210, or a bank of IR heaters 116 disposed between two heat management zones, it is understood the IR heaters may be disposed at other predetermined locations and employed in different arrangements and configurations in other embodiments of the reflow soldering apparatus 101 to provide selective IR radiation to targeted components as needed and are not limited to the locations, arrangements and configurations illustrated in FIGS. 4 and 5. In addition, it is understood the IR heaters may be employed in a reflow soldering apparatus 101 that comprises one or more heat management zones as required to heat the components 104A and 104B and the circuit board 106 to desired preheat and reflow temperatures and is not limited to the heat management zones illustrated in FIGS. 4 and 5.

A feature and advantage of the present invention is the combination of selective IR heating and convection heating may be achieved in prior art reflow soldering systems to improve the efficiency of reflow soldering. For instance, the selective IR heating may be employed in conjunction with convection heating in zones IV and V of the prior art reflow soldering system 30' shown in FIG. 1 to improve the heating efficiency of each zone and the reflow soldering system 30' overall. Zones IV and V primarily employ convection heating to increase the temperature of the components 18 and circuit board 14. Zone IV employs relatively low velocity hot air 60 delivered from a gas diffuser 58C to increase the temperature of the components 18 and circuit board 14 to just below the reflow temperature, while zone V employs relatively high velocity hot air delivered from air knives 80, 82 and 84 to rapidly elevate the temperature of the components 18 and circuit board 14 to just above the reflow temperature. As described above, convection heating is used in prior art reflow soldering systems to help avoid excessive heating of components and circuit boards, and to substantially reduce the possibility of thermal damage to heat-sensitive components and areas of the circuit board, particularly during the "spike" and reflow phases of reflow soldering. Incorporation of the selective IR heating according to the invention with the prior art convection heating employed in zones IV and V would provide sufficient IR radiation to targeted components 18, such as relatively large components having high heat capacities and/or high profiles, and ensure the temperature of such targeted components 18 is selectively and rapidly increased to the desired spike and reflow temperatures. The convection heating of zones IV and V ensures that all components 18, including relatively small, heat-sensitive components having small heat capacities and/or low profiles, as well as areas of the circuit board 1404, are substantially uniformly heated to the desired spike and reflow temperatures without overheating and/or under heating individual components 18. The overall effect is the desired spike and reflow temperatures of the components 18 and circuit board 14 are achieved more accurately, rapidly and efficiently in zones IV and V with a concomitant elimination or at least substantial reduction of the possibility of thermal damage to individual components 18, as well as areas of the circuit board 14. Although the selective IR heating according to the invention is described with reference to zones IV and V of the prior art reflow soldering system 30', it is understood that the selective IR heating may be employed in the heating zones I, II and III of other embodiments as needed to improve the performance and efficiency of the individual heating zones and the reflow soldering system 30' overall.

Figure 6:
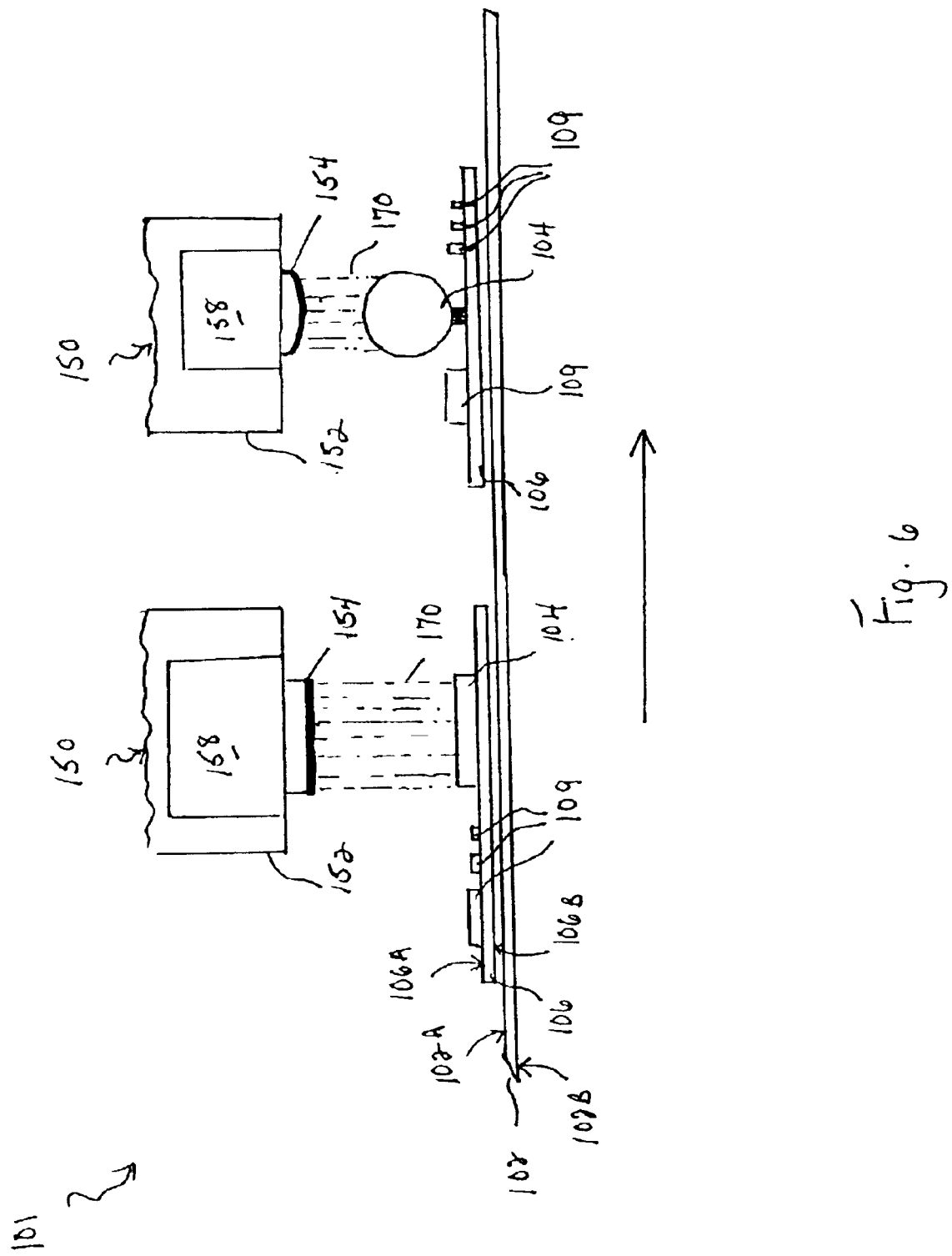
FIG. 6 is a side elevational view of a second embodiment of the reflow soldering apparatus according to the invention.
Figure 7:
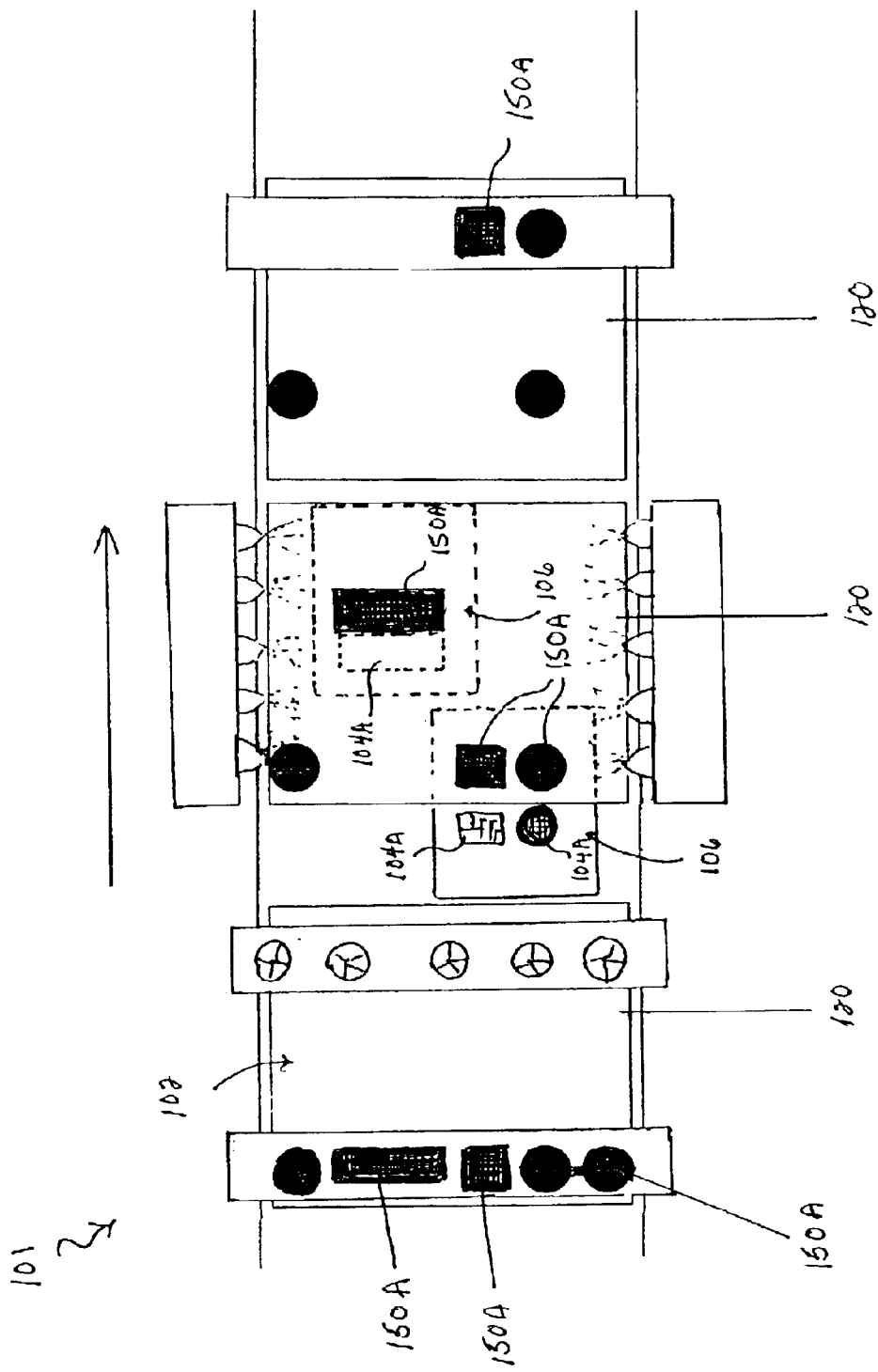
FIG. 7 is a top view of the second embodiment.

Referring to FIGS. 6 and 7, in a second embodiment of the reflow soldering apparatus 101 of the invention, the combination of selective IR heating and convection heating comprises one or more IR heat diffusers 150 that provide IR radiation against targeted components 104 mounted on a circuit board 106 to heat the targeted components 104 and circuit board 106 to the desired temperature. As shown in a cross-sectional view of FIG. 6, an IR heat diffuser 150 comprises a housing 152 with a perforated diffuser plate 154 substantially parallel to a top surface 102A or a bottom surface 102B of a continuous conveyor 102 such that the IR radiation 170 emitted from the IR heat diffuser 150 is projected downwardly toward the top surface 102A and upwardly toward the bottom surface 102B of the conveyor 102 in a substantially vertical orientation. The substantially vertical orientation of IR radiation 170 emitted by the IR heat diffuser 150 restricts the IR radiation 170 to the targeted components 104 mounted to a top surface 106A and/or a bottom surface 106B of the circuit board 106 as the circuit board 106 conveys the targeted components 104 through a line-of-sight of the IR heat diffuser 150. The selective IR heating thereby eliminates or at least substantially reduces the extent of undesired exposure of small, heat-sensitive and/or low profile components 109 and areas of the circuit board 106 to IR radiation.

The IR heat diffuser 150 further includes a heat source 158 disposed within the housing 152 to provide heat to the diffuser plate 154. The heat source 158 provides sufficient heat to the diffuser plate 154 such that the diffuser plate 154 absorbs and emits sufficient radiant IR heat toward the circuit board 106 and the targeted components 104 mounted thereon. The heat source 158 may include, although is not limited to, an electric or IR type of heater that may be independently operated such that the IR heat diffuser 150 selectively heats or emits IR radiation against the components 104 only when required.

An advantage and feature of employing the IR heat diffusers 150 as sources of IR radiation is the IR heat diffuser 150 itself or at least the diffuser plate 154 may be constructed and arranged with the same profile or the same configuration or shape as the targeted components 104. For instance, as shown in FIG. 7, the IR diffusers 150A may be configured in substantially rectangular, square, circular or other shape to correspond with the substantially rectangular, square, circular or other shape or profile of the components 104A targeted to receive IR radiation. The components 104A may be targeted for IR radiation due to their relatively large size and/or high profile in comparison to other components mounted on the circuit board 106. The extent of selective IR radiation emitted against the targeted components 104A is further restricted by the substantially similar profile or shape of the IR heat diffuser 150 or the diffuser plate 154.

Figure 8:
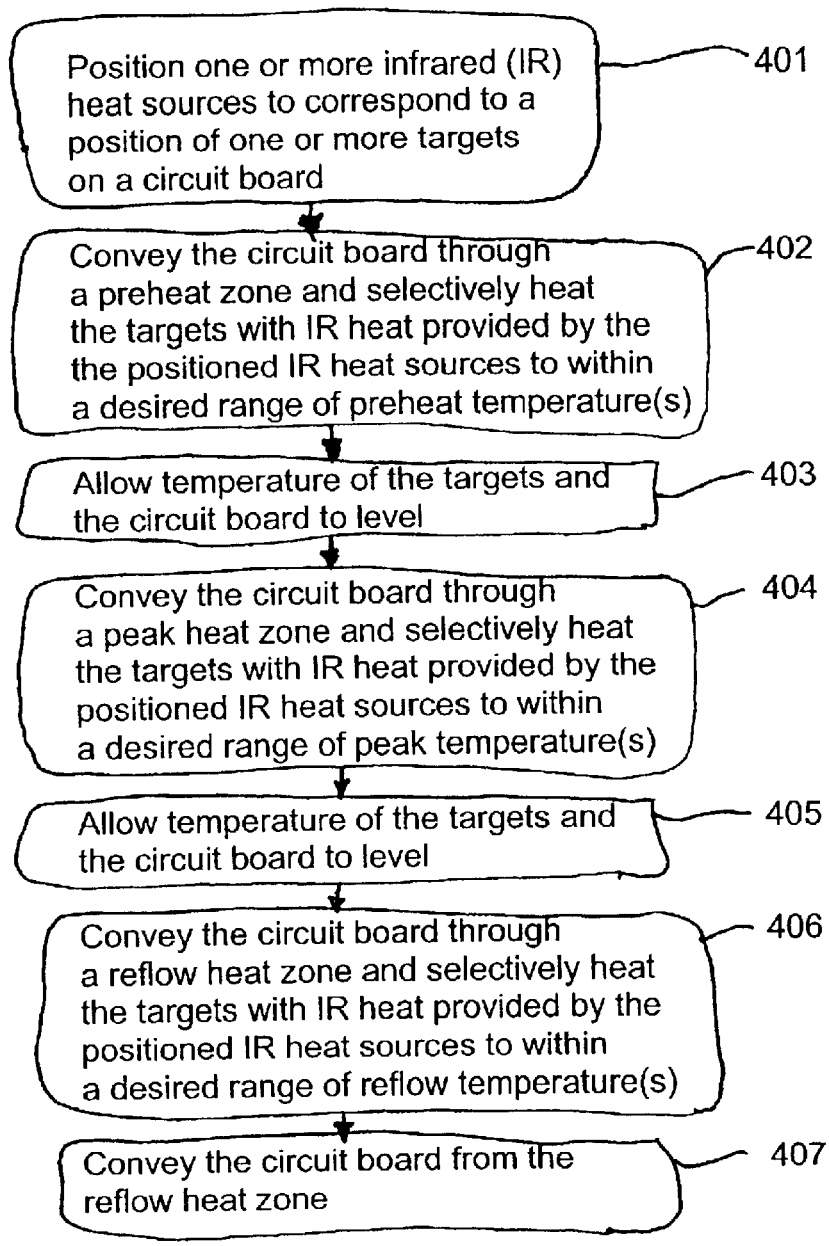
FIG. 8 is a flow diagram of a method of reflow soldering according to the invention.
Figure 9:
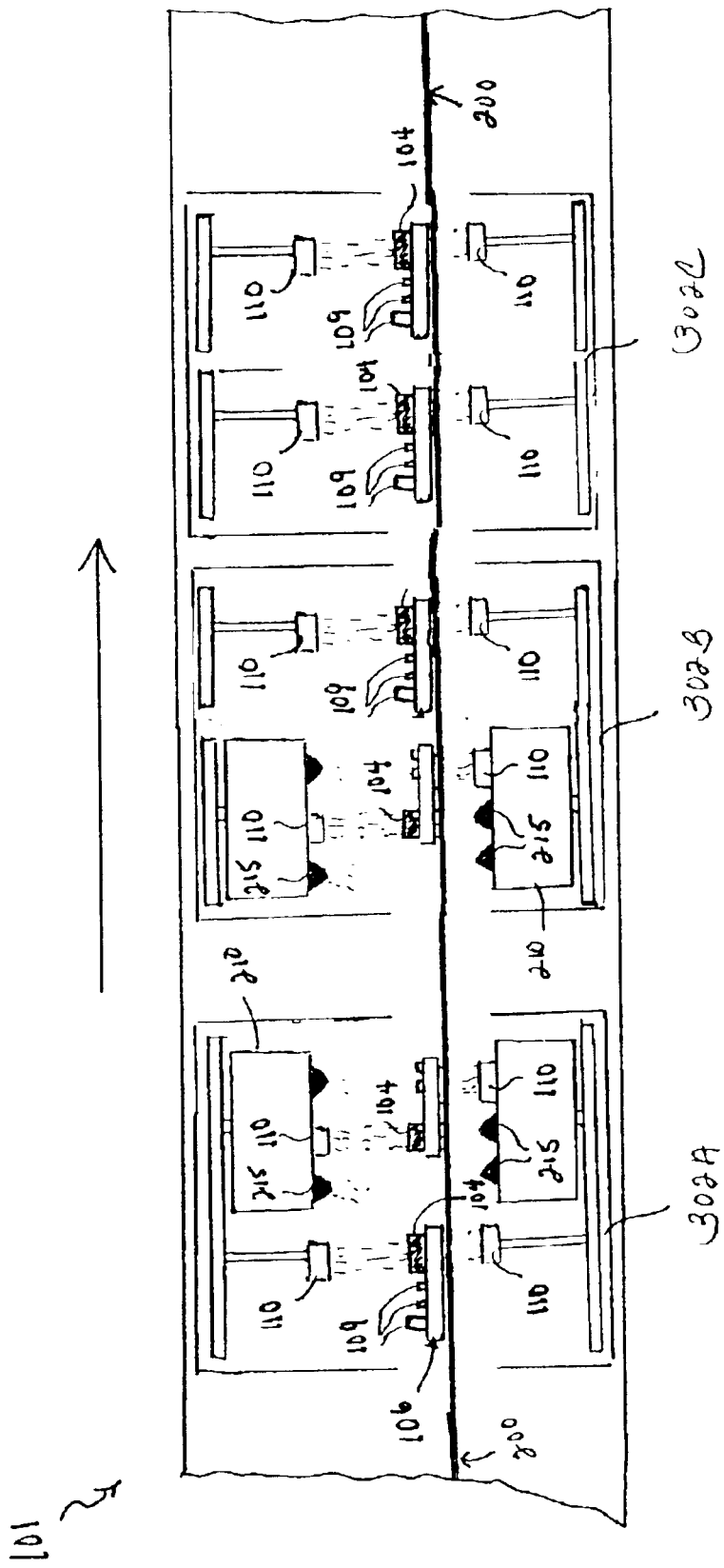
FIG. 9 is a side elevational view illustrating the method shown in FIG. 8.

In operation, referring to FIGS. 8–9, with further reference to FIGS. 2–7, a method 400 of reflow soldering includes the stages shown. The method 400, however, is exemplary only and not limiting. The method 400 can be altered, e.g., by having stages added, removed or rearranged.

At stage 401, the one or more infrared (IR) heating sources 110 disposed in one or more of the heat management zones 120 of the reflow soldering apparatus 101 are positioned, e.g., manually or by automatic and/or remote switches operatively coupled to the IR heat sources 110, to correspond to one or more positions of the targets 104, e.g., electronic components, on the circuit board 106 such that when the circuit board 106 is conveyed through the one or more heat management zones 120 at least one of the targets 104 is conveyed through a line-of-sight of at least one of the IR heat sources 110.

At stage 402, the circuit board 106 is conveyed by the conveyor 102 through a first heat management zone 302A, e.g., a preheat zone, and the targets 104 and/or the circuit board 106 are heated with IR heat provided by the one or more IR heat sources 110 to within a desired range of preheat temperature(s). One or more gas diffusers 210 having one or more nozzles 215 can provide convection heat to the preheat zone.

At stage 403, a temperature of the targets 104 and/or the circuit board 106 is allowed to level or stabilize, e.g., by controlling a residence time of the targets 104 and the circuit board 106 in the preheat zone 302A, by controlling a residence time of the targets 104 and the circuit board in the line-of-sight of the at least one IR heat source 110 and/or by controlling a duration the at least one IR heat source 110 emits heat, such that the temperatures of the targets 104 and/or the circuit board 106 are substantially uniform, e.g., a temperature of one target 104 approximates a temperature of another target 104 and/or the circuit board 106 and/or temperatures of the targets 104 approximate a temperature of the circuit board 106, before the circuit board 106 is conveyed from the preheat zone 302A.

At stage 404, the circuit board 106 is conveyed from the preheat zone 302A to a second heat management zone 302B, e.g., a "peak" heat zone, and the targets 104 and/or the circuit board 106 are heated with IR heat provided by the one or more IR heat sources 110 to within a desired range of peak temperature(s). One or more gas diffusers 210 having one or more nozzles 215 can provide convection heat to the peak heat zone.

At stage 405, a temperature of the targets 104 and/or the circuit board is allowed to level or stabilize, e.g., by controlling a residence time of the targets 104 and the circuit board 106 in the second peak heat zone 302B, by controlling a residence time of the targets 104 and the circuit board in the line-of-sight of the at least one IR heat source 110 and/or by controlling a duration the at least one IR heat source 110 emits heat, such that the temperatures of the targets 104 and/or the circuit board 106 are substantially uniform, e.g., a temperature of one target 104 approximates a temperature of another target 104 and/or the circuit board 106 and/or temperatures of the targets 104 approximate a temperature of the circuit board 106, before the circuit board 106 is conveyed from the peak heat zone 302B.

At stage 406, the circuit board 106 is conveyed from the peak heat zone 302B to a third heat management zone 302C, e.g. a "peak" or reflow heat zone, and the targets 104 and/or the circuit board 106 are heated with IR heat provided by the one or more IR heat sources 110 to within a range of peak or reflow temperatures(s), e.g., a range of temperature(s) just above reflow temperature(s) of a solder applied to one or more of the targets 104 and/or the circuit board 106 to permit the solder reflow. One or more gas diffusers 210 having one or more nozzles 215 can provide convection heat to the preheat zone.

At stage 407, the circuit board 106 is conveyed from the reflow heat zone 302C and from the apparatus 101.

The stages of heating the targets 104 and/or the circuit board 106 can include heating via selective infrared (IR) heating with the one or more IR heat sources 110, convection heating and/or a combination thereof. Whether IR heating, convection heating or a combination of IR and convection heating are used, heating the targets 104 and/or the circuit board 106 depends on a temperature function of each of the heat management zones 302A–302C, and a type and size of the targets 104 and/or the circuit board 106. For example, preheating the targets 104 and the circuit board 106 to a desired preheat temperature may include a combination of selective IR heating and convection heating to warm-up the cold targets 104 and/or he circuit board 106 to within a desired range of preheat temperature(s). For another example, the targets 104 and/or the circuit board 106 may be heated to within a range of desired "peak" and/or a reflow temperature(s) by convection heating with selective IR heating provided by the one or more IR heat sources 110 to help heat specific targets 104 and/or areas of the circuit board 106. Selective IR heat can be provided to the targets 104 and/or the circuit board 106 at certain intervals, e.g., as needed or as determined, to help achieve substantially uniform peak and reflow temperatures of the targets 104 and/or the circuit board 106, e.g., a temperature of one target 104 approximates a temperature of another target 104 and/or the circuit board 106 and/or temperatures of the targets 104 approximate a temperature of the circuit board 106.

The process of selective IR heating can be used to heat targets 104 that are relatively large in size or have a high profile in relation to other targets 104 of small size and/or low profile to help provide sufficient heat to the targets 104. An optimal position of each IR heat source 110 can be empirically determined in relation to a position or site of one or more of the large and/or high profile targets 104 on the circuit board 106 such that each IR heat source 110 is disposed in one or more of the heat management zones 302A–302C to correspond to one or more the sites of the large and/or high profile targets 104 when the circuit board 106 is conveyed through the zones 302A–302C.

The one or more IR heat sources 110 can be disposed and configured such that the IR heat sources 110 emit heat into the heat management zone 302A–302C alone or in combination with convection heating to substantially continuously increase a temperature of the targets 104 and/or the circuit board 106 to within desired ranges of preheat, peak and/or reflow temperature(s) before the circuit board 106 is conveyed from the zones 302A–302C. Each of the IR heat sources 110 can be independently operated and/or controlled by a feedback control such that one or more IR heat sources 110 emit heat only during intervals in which large and/or high profile targets 104 pass through the lines-of-sight of the IR heat sources 110. Convection heat can be similarly independently operated and controlled by a feedback control to adjust a rate of flow and/or a velocity at which hot or warm gas, e.g., air, is delivered to the heat management zones 302A–302C.

The method 400 can include a range of preheat temperature(s), e.g., from about ambient to about 200° C., a range of "peak" temperature(s) just below a desired range of reflow temperature(s), e.g., from about 180° C. to about 230° C., and a range of second "peak" or reflow temperature (s) just above a desired reflow temperature(s), e.g., from about 200° C. to about 260° C. The invention, however, is not limited to temperature ranges and can include IR heat sources disposed and configured to provide IR heat within other ranges of temperature(s).

The process 400 of selective IR heating limits IR radiant heat to specific targets 104 and at certain intervals when the targets 104 pass through the lines-of-sight of the IR heat sources 110 to help eliminate or to help at least substantially reduce the extent of undesired exposure of non-targeted components 109, e.g., small and/or low profile components, and non-targeted areas of the circuit board 106 to IR radiation. The process 400 helps to eliminate or helps to at least substantially reduce the risk of overheating and thermal damage to non-targeted components 109 and areas of the circuit board 106.

The process 400 helps to compensate for different thermal absorption capacities of the targets 104 due to the differences between the optical and mass characteristics of small and large targets 104. The process 400 helps to compensate for different IR absorption rates of the targets 104 due to the differences between reflectivity and/or due to the shadowing or nesting of the targets 104. While the selective IR heating directs IR radiation to the targets 104, the convection heating provides circulation of hot or warm gas, e.g., air, to, across and/or around the targets 104. The convection heating helps to lower temperatures of the large targets 104 having high heat capacities, while helps to raise temperatures of the small targets 104 having low heat capacities. In particular, the convection heating helps to raise temperatures of shadowed or nested and/or low profile targets that are otherwise prevented from receiving heat. An overall heating effect of the combination of the selective IR heating and the convective heating of the targets 104 is to help control the temperature of the targets 104 and the circuit board 106 within desired ranges of temperature(s).

The process 400 is efficient and provides a rate of thermal leveling of the targets 104 and the circuit board 106 that helps to provide efficiency in the performance of the individual heat management zones. Energy savings can be realized with a reduction in energy consumption for reflow heating and soldering. An increased process throughput of reflowed circuit boards can be achieved. With a reduction of thermal damage to the targets 104 and the circuit board 106, a consequent increase in circuit boards 106 being successfully processed in a single pass through the apparatus 101 can be achieved.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A reflow soldering apparatus for soldering an electronic component to an unshielded circuit board, the apparatus comprising:

a housing having a conveyor to convey the unshielded circuit board through the housing;

at least one heating zone disposed in the housing; and at least one infrared heater disposed in the at least one heating zone, the at least one infrared heater being spaced from the conveyor and disposed and configured to emit unreflected infrared heat toward the conveyor, the at least one infrared heater being further disposed at a position in the heating zone that corresponds to a position of the component on a surface of the unshielded circuit board when the circuit board is conveyed through the heating zone, such that, as the circuit board is conveyed through the heating zone, the component is conveyed through a line-of-sight of the infrared heater, the infrared heater being further configured to direct the unreflected infrared heat only to the position of the component on the circuit board when the circuit board is conveyed through the heating zone, such that, as the circuit board is conveyed through the heating zone, the component receives a substantial portion of the unreflected infrared heat the infrared heater emits and is selectively heated.

2. The apparatus of claim 1 wherein the at least one infrared heater is located above the conveyor.

3. The apparatus of claim 1 wherein the at least one infrared heater is located below the conveyor.

4. The apparatus of claim 1 further comprising a control system operatively coupled to the apparatus to control operation of the at least one infrared heater.

5. The apparatus of claim 4 wherein the control system includes a programmable controller to control operation of the at least one infrared heater.

6. The apparatus of claim 5 wherein the programmable controller includes at least one stored variable.

7. The apparatus of claim 5 further comprising at least one sensor disposed in the heating zone, the at least one sensor being configured to detect at least one variable of operation of the heating zone such that when the sensor detects the at least one variable, the sensor sends a signal to the programmable controller, and the programmable controller, in response to receipt of the signal, controls the operation of the at least one infrared heater.

8. The apparatus of claim 5 wherein the programmable controller selectively controls the operation of the at least one infrared heater.

9. The apparatus of claim 7 wherein the sensor includes a temperature sensor that detects a temperature in the heating zone such that the sensor sends a signal to the programmable controller corresponding to the temperature and the programmable controller, in response to receipt of the signal, controls the operation of the at least one infrared heater.

10. The apparatus of claim 9 wherein the programmable controller compares the signal to at least one stored variable to selectively operate the at least one infrared heater.

11. The apparatus of claim 7 wherein the sensor includes an optical sensor that detects the circuit board in the heating zone such that the sensor sends a signal to the programmable controller corresponding to detection of the circuit board and the programmable controller, in response to receipt of the signal, controls the operation of the at least one infrared heater.

12. The apparatus of claim 11 wherein the programmable controller compares the signal to at least one stored variable to selectively operate the a least one infrared heater.

13. The apparatus of claim 1 wherein the at least one infrared heater is disposed in an array of infrared heaters.

14. The apparatus of claim 1 wherein the at least one infrared heater is disposed in a linear array of infrared heaters, the linear array being disposed and configured to extend above and across the conveyor in a substantially perpendicular orientation to a direction in which the conveyor conveys the circuit board.

15. A reflow soldering apparatus for soldering an electronic component to an unshielded circuit board, the apparatus comprising:

a housing having a conveyor to convey the unshielded circuit board through the housing;

at least one heating zone disposed in the housing;

at least one infrared heater disposed in the at least one heating zone, the at least one infrared heater being spaced from the conveyor and disposed and configured to emit unreflected infrared heat toward the conveyor, the at least one infrared heater being further disposed at a position in the heating zone that corresponds to a position of the component on a surface of the unshielded circuit board when the circuit board is conveyed through the heating zone, such that, as the circuit board is conveyed through the heating zone, the component is conveyed through a line-of-sight of the infrared heater, the infrared heater being further configured to direct the unreflected infrared heat only to the position of the component on the circuit board when the circuit board is conveyed through the heating zone, such that, as the circuit board is conveyed through the heating zone, the component receives a substantial portion of the unreflected infrared heat the infrared heater emits and is selectively heated; and at least one convection heater disposed in the heating zone, the convection heater being spaced from the conveyor to heat the component by convection heat.

16. A reflow soldering apparatus for soldering an electronic component to an unshielded circuit board, the apparatus comprising:

a housing having a conveyor to convey the unshielded circuit board through the housing;

at least one preheating zone disposed in the housing;

at least one infrared heater disposed in the preheating zone, the at least one infrared being spaced from the conveyor and disposed and configured to emit unreflected infrared heat toward the conveyor, the at least one infrared heater being further disposed at a position in the preheating zone that corresponds to a position of the component on a surface of the unshielded circuit board when the circuit board is conveyed through the preheating zone, such that, as the circuit board is conveyed through the preheating zone, the component is conveyed through a line-of-sight of the infrared heater, the infrared heater being further configured to direct the unreflected infrared heat only to the position of the component on the circuit board when the circuit board is conveyed through the preheating zone, such that, as the circuit board is conveyed through the preheating zone, the component receives a substantial portion of the unreflected infrared heat the infrared heater emits and is selectively preheated;

at least one reflow zone disposed in the housing; and at least one infrared heater disposed in the reflow zone, the at least one infrared heater being spaced from the conveyor and disposed and configured to emit unreflected infrared heat toward the conveyor, the at least one infrared heater being further disposed at a position in the reflow zone that corresponds to the position of the component on a surface of the unshielded circuit board when the circuit board is conveyed through the reflow zone, such that, as the circuit board is conveyed through the reflow zone, the component is conveyed through a line-of-sight of the infrared heater, the infrared heater being configured to direct the unreflected infrared heat only to the position of the component on the circuit board when the circuit board is conveyed through the reflow zone, such that, as the circuit board is conveyed through the reflow zone, the component receives a substantial portion of the unreflected infrared heat the infrared heater emits and is selectively heated.

17. The apparatus of claim 16 wherein the at least one preheating infrared heater and the at least one reflow infrared heater are located above the conveyor.

18. The apparatus of claim 16 wherein the at least one preheating infrared heater and the at least one reflow infrared heater are located below the conveyor.

19. The apparatus of claim 16 further comprising a control system operatively coupled to the apparatus to control operation of the infrared heaters.

20. The apparatus of claim 19 wherein the control system includes a programmable controller to control operation of the infrared heaters in at least one of the preheating zone and the reflow zone.

21. The apparatus of claim 20 wherein the programmable controller includes at least one stored variable.

22. The apparatus of claim 20 further comprising at least one sensor disposed in at least one of the preheating zone and the reflow zone, the at least one sensor being configured to detect at least one variable of operation of at least one of the preheating zone and the heating zone such that when the sensor detects the at least one variable, the sensor sends a signal to the programmable controller, and the programmable controller, in response to receipt of the signal, controls the operation of at least one of the infrared heater of the preheating zone and the reflow infrared heater.

23. The apparatus of claim 22 wherein the programmable controller selectively controls the operation of at least one of the infrared heater of the preheating zone and the reflow infrared heater.

24. The apparatus of claim 22 wherein the sensor includes a temperature sensor that detects a temperature in at least one of the preheating zone and the reflow zone such that the sensor sends a signal to the programmable controller corresponding to the temperature and the programmable controller, in response to receipt of the signal, controls the operation of at least one of the infrared heater in the preheating zone and the reflow infrared heater.

25. The apparatus of claim 24 wherein the programmable controller compares the signal to at least one stored variable to selectively operate at least one of the infrared heater in the preheating zone and the reflow infrared heater.

26. The apparatus of claim 22 wherein the sensor includes an optical sensor that detects the circuit board in at least one of the preheating zone and the reflow zone such that the sensor sends a signal to the programmable controller corresponding to detection of the circuit board and the programmable controller, in response to receipt of the signal, controls the operation of at least one of the infrared heater in the preheating zone and the reflow infrared heater.

27. The apparatus of claim 26 wherein the programmable controller compares the signal to at least one stored variable to selectively operate at least one of the infrared heater in the preheating zone and the reflow infrared heater.

28. The apparatus of claim 16 wherein at least one of the infrared heater in the preheating zone and the reflow heater is disposed in an array of infrared heaters.

29. The apparatus of claim 16 wherein at least one of the infrared heater in the preheating zone and the reflow heater is disposed in a linear array of infrared heaters, the linear array being disposed and configured to extend above and across the conveyor in a substantially perpendicular orientation to a direction in which the conveyor conveys the circuit board.

30. The apparatus of claim 16 further comprising at least one convection heater disposed in at least one of the preheating zone and the reflow zone, the at least one convection heater being spaced from the conveyor to heat the one or more components.

31. An infrared heating assembly for selective heating of a target disposed on a generally planar unshielded mounting, the assembly comprising:

a housing; and one or more infrared heat sources disposed in the housing, the infrared heat sources being spaced from a conveyor, the conveyor extending through the housing from a first open end to a second open end to convey the target on the unshielded mounting through the housing and past the one or more infrared heat sources, at least one of the infrared heat sources being disposed and configured to emit unreflected infrared heat toward the conveyor, and being further disposed at a position in the housing that corresponds to a position of the target on a surface of the unshielded mounting when the mounting is conveyed through the housing, such that, as the unshielded mounting is conveyed through the housing, the target is conveyed through a line-of-sight of the infrared heat source, the infrared heat source being still further configured and disposed to direct the unreflected infrared heat only to the position of the target on the unshielded mounting when the mounting is conveyed through the heating zone, such that, as the mounting is conveyed through the housing, the target receives a substantial portion of the unreflected infrared heat the infrared heater emits and is selectively heated.

32. The assembly of claim 31 wherein the at least one infrared heat source is located at one of above the conveyor and below the conveyor.

33. The assembly of claim 31 wherein the one or more infrared heat sources are disposed in an array.

34. The assembly of claim 31 wherein the one or more infrared heat sources are disposed in a linear array, the linear array being disposed and configured to extend above and across the conveyor in a substantially perpendicular orientation to a direction in which the conveyor conveys the one or more targets.

35. The assembly of claim 31 further comprising a controller operatively coupled at least one of the first infrared heat source and the one or more infrared heat sources.

36. The assembly of claim 35 wherein the controller includes a programmable controller to control operation of at least one of the first infraredheat source and the one or more infrared heaters.

37. The assembly of claim 36 further comprising at least one sensor disposed in the housing, the sensor being disposed and configured to detect at least one variable of operation in the housing such that when the sensor detects the variable, the sensor sends a signal corresponding to the variable to the programmable controller, and, the programmable controller, in response to receipt of the signal, controls operation of at least one of the first infrared heat source and the one or more infrared heat sources.

* * * * *

UNITED STATES PATENT AND TRADEMARK OFFICE
CERTIFICATE OF CORRECTION

PATENT NO. : 6,768,083 B2
DATED : July 27, 2004
INVENTOR(S) : Alan Rae et al.

It is certified that error appears in the above-identified patent and that said Letters Patent is hereby corrected as shown below:

Title page,
Item [75], Inventors, "Mark A. Hodge" residence, delete "MI" and insert -- MO --;

Column 16,
Line 50, delete "a" and insert -- at --;

Column 20,
Line 14, replace "infraredheat" and insert -- infrared heat --.

Signed and Sealed this

Fourth Day of October, 2005

JON W. DUDAS
*Director of the United States Patent and Trademark Office*